US009013930B2

(12) United States Patent
Chan et al.

(10) Patent No.: US 9,013,930 B2
(45) Date of Patent: Apr. 21, 2015

(54) MEMORY DEVICE WITH INTERLEAVED HIGH-SPEED READING FUNCTION AND METHOD THEREOF

(71) Applicant: Winbond Electronics Corp., Taichung (TW)

(72) Inventors: Johnny Chan, Fremont, CA (US); Teng Su, Milpitas, CA (US)

(73) Assignee: Winbond Electronics Corp., Taichung (TW)

( * ) Notice: Subject to any disclaimer, the term of this patent is extended or adjusted under 35 U.S.C. 154(b) by 201 days.

(21) Appl. No.: 13/722,413

(22) Filed: Dec. 20, 2012

(65) Prior Publication Data

US 2014/0177343 A1     Jun. 26, 2014

(51) Int. Cl.
*G06F 12/06*     (2006.01)
*G11C 7/10*     (2006.01)

(52) U.S. Cl.
CPC .......... *G11C 7/1012* (2013.01); *G06F 12/0607* (2013.01); *G11C 7/1015* (2013.01); *G11C 7/1042* (2013.01)

(58) Field of Classification Search
CPC .. G11C 5/066; G11C 27/04; G11C 2207/107; G11C 7/10; G11C 7/1039; G11C 7/1015; G06F 12/0607; G06F 2212/7208; G06F 12/0879

USPC ............ 711/103, 105, 5, 141, 154, 157, 167, 711/170; 365/189.01, 189.02, 220, 230.02, 365/230.03, 233.1, 238
See application file for complete search history.

(56) References Cited

U.S. PATENT DOCUMENTS

| | | | | |
|---|---|---|---|---|
| 6,026,465 | A * | 2/2000 | Mills et al. ..................... | 711/103 |
| 6,333,890 | B1 | 12/2001 | Niimi et al. | |
| 6,762,972 | B2 | 7/2004 | La | |
| 2001/0044875 | A1* | 11/2001 | Mailloux et al. .............. | 711/105 |
| 2009/0187701 | A1* | 7/2009 | Kim .............................. | 711/103 |

* cited by examiner

*Primary Examiner* — Richard Elms
*Assistant Examiner* — Ajay Ojha
(74) *Attorney, Agent, or Firm* — Muncy, Geissler, Olds & Lowe, P.C.

(57) ABSTRACT

A method includes steps of: providing a first memory cell array including a plurality of first word lines, wherein a plurality of first data are stored in the first memory cell array; providing a second memory cell array including a plurality of second word lines, wherein the second memory cell array is separated from the first memory cell array, and a plurality of second data are stored in the second memory cell array; selecting one of the first word lines and one of the second word lines at a same time or an overlapping time; alternately selecting a first address of the first memory cell array and a second address of the second memory cell array to alternately read a first corresponding portion of the first data and a second corresponding portion of the second data from the first memory cell array and the second memory cell array.

18 Claims, 8 Drawing Sheets

MEMORY DEVICE WITH INTERLEAVED HIGH-SPEED READING FUNCTION AND METHOD THEREOF

BACKGROUND OF THE INVENTION

1. Field of the Invention

The disclosure generally relates to a memory device, and more particularly, relates to a memory device providing a high-speed reading function.

2. Description of the Related Art

FIG. 1 is a diagram for illustrating a traditional memory device 100. The memory device 100 comprises a memory cell array 110 and a sense amplifier 160. A plurality of data, for example, bytes 0-7, are stored in the memory cell array 110. The memory cell array 110 comprises a plurality of word lines 111 and 112 and a plurality of bit lines for selecting addresses of the data. When an external device reads the data from the memory cell array 110, only one word line can be selected in one sense cycle. Otherwise, some errors may occur. For example, if the word lines 111 and 112 are both selected at the same time, the sense amplifier 160 cannot differentiate the data read from the byte 0 and the byte 4. Accordingly, the reading speed of the traditional memory device 100 is limited.

BRIEF SUMMARY OF THE INVENTION

In one exemplary embodiment, the disclosure is directed to a memory device, comprising: a first memory cell array, comprising a plurality of first word lines and a plurality of first bit lines, wherein a plurality of first data are stored in the first memory cell array; a second memory cell array, separated from the first memory cell array, and comprising a plurality of second word lines and a plurality of second bit lines, wherein a plurality of second data are stored in the second memory cell array; a control logic circuit, allowed to select one of the first word lines and one of the second word lines at a same time or an overlapping time, and alternately selecting a first address of the first memory cell array and a second address of the second memory cell array such that a first corresponding portion of the first data and a second corresponding portion of the second data are alternately read from the first memory cell array and the second memory cell array; a first sense amplifier, coupled via the first bit lines to the first memory cell array, and amplifying the first corresponding portion of the first data; and a second sense amplifier, coupled via the second bit lines to the second memory cell array, and amplifying the second corresponding portion of the second data.

In another exemplary embodiment, the disclosure is directed to a method for reading data from a memory device, comprising the steps of: providing a first memory cell array comprising a plurality of first word lines and a plurality of first bit lines, wherein a plurality of first data are stored in the first memory cell array; providing a second memory cell array comprising a plurality of second word lines and a plurality of second bit lines, wherein the second memory cell array is separated from the first memory cell array, and a plurality of second data are stored in the second memory cell array; selecting one of the first word lines and one of the second word lines at a same time or an overlapping time; alternately selecting a first address of the first memory cell array and a second address of the second memory cell array to alternately read a first corresponding portion of the first data and a second corresponding portion of the second data from the first memory cell array and the second memory cell array; and amplifying the first corresponding portion of the first data and the second corresponding portion of the second data.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 2:
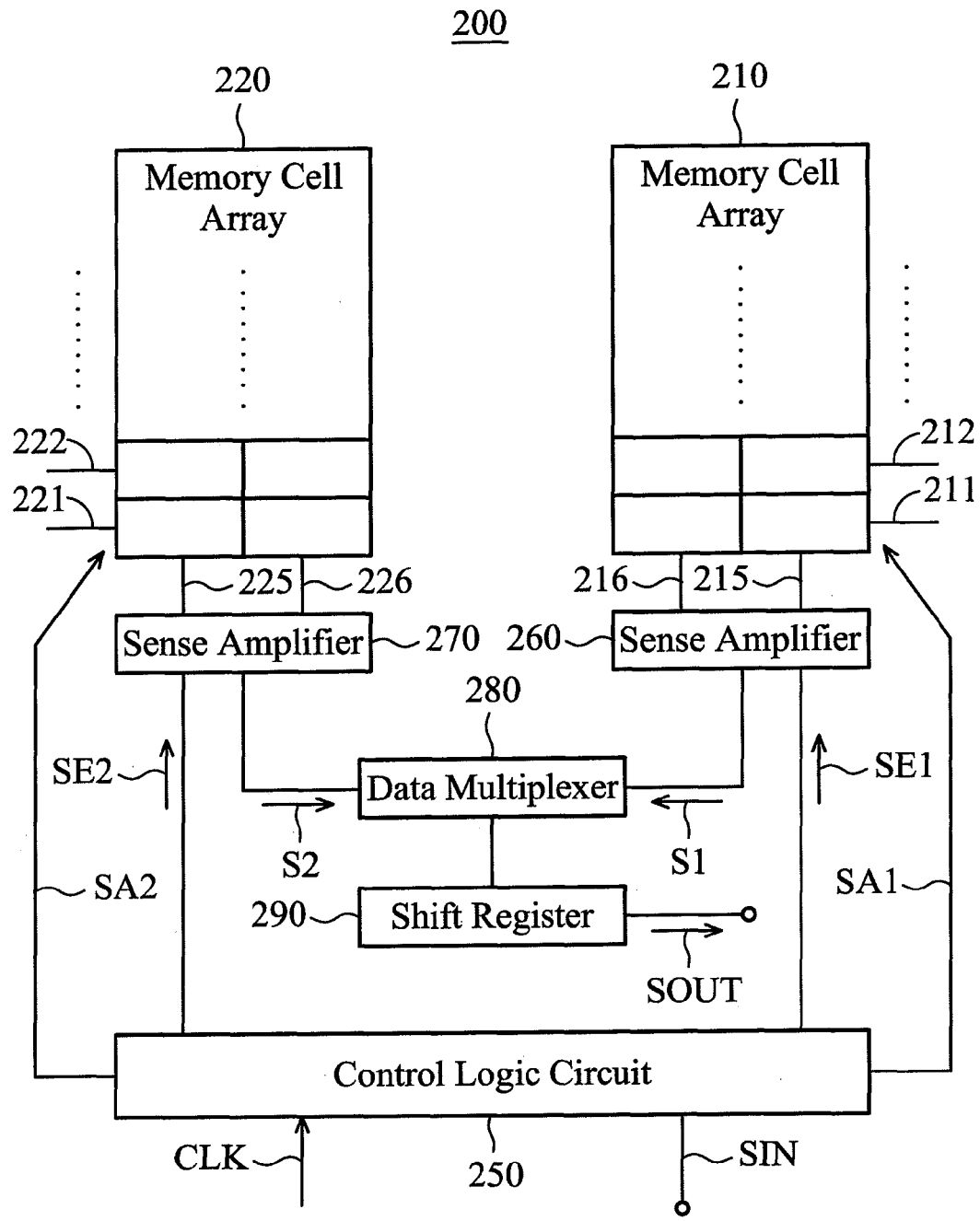
FIG. 2 is a diagram for illustrating a memory device according to an embodiment of the invention.

FIG. 2 is a diagram for illustrating a memory device 200 according to an embodiment of the invention. The memory device 200 may be a NOR flash memory, but is not limited to this. As shown in FIG. 2, the memory device 200 comprises a first memory cell array 210, a second memory cell array 220, a control logic circuit 250, a first sense amplifier 260, a second sense amplifier 270, a data multiplexer 280, and a shift register 290.

The first memory cell array 210 is separated from the second memory cell array 220. A plurality of first data (e.g., bytes) are stored in the first memory cell array 210, and a plurality of second data (e.g., bytes) are stored in the second memory cell array 220. A combination of the first data and the second data may form complete continuous data. However, in some embodiment, the first data stored in the first memory cell array 210 and the second data stored in the second memory cell array 220 are both discontinuous data. The first memory cell array 210 comprises a plurality of first word lines 211 and 212 and a plurality of first bit lines 215 and 216. The first sense amplifier 260 is coupled via the first bit lines to the first memory cell array 210. The second memory cell array 220 also comprises a plurality of second word lines 221 and 222 and a plurality of second bit lines 225 and 226. The second sense amplifier 270 is coupled via the second bit lines to the second memory cell array 220. The word lines and the bit lines are configured to select addresses of any memory cell array during a reading process. To simplify the diagram, not all of the word lines and the bit lines are displayed in FIG. 2. It is understood that each memory cell array may comprise more word lines and more bit lines.

The control logic circuit 250 is configured to read the first data from the first memory cell array 210 and the second data from the second memory cell array 220. In some embodiments, the control logic circuit 250 receives an input signal SIN indicating a starting address of any memory cell array, and performs a reading process beginning from the starting address. During the reading process, the control logic circuit 250 is allowed to select one of the first word lines and one of the second word lines at a same time or an overlapping time. For example, the first word line 211 of the first memory cell array 210 and the second word line 221 of the second memory cell array 220 may be selected at a same time. Since the first memory cell array 210 is separated from the second memory cell array 220, the selection of one first word line is independent of the selection of another second word line, and the sense amplifiers 260 and 270 can differentiate the read data without confusion. In a preferred embodiment, the control logic circuit 250 alternately selects a first address SA1 of the first memory cell array 210 and a second address SA2 of the second memory cell array 220 such that a first corresponding portion S1 of the first data and a second corresponding portion S2 of the second data are alternately read from the first memory cell array 210 and the second memory cell array 220. Note that each corresponding portion may comprise one or more data. Next, the first sense amplifier 260 amplifies the read first corresponding portion S1, and the second sense amplifier 270 amplifies the read second corresponding portion S2. The data multiplexer 280 is coupled to the first sense amplifier 260 and the second sense amplifier 270. Then, the data multiplexer 280 selectively transmits the amplified first corresponding portion S1 and the amplified second corresponding portion S2 to the shift register 290, and the shift register 290 sequentially generates a plurality of output data SOUT according to the first corresponding portion S1 and the second corresponding portion S2.

More particularly, the control logic circuit 250 further receives a clock signal CLK, and after the control logic circuit 250 receives the input signal SIN indicating the starting address, the control logic circuit 250 transmits sensing enable signals SE1 and SE2 to enable the reading process. The detailed operations of the memory device 200 will be illustrated in the following embodiments.

Figure 3A:
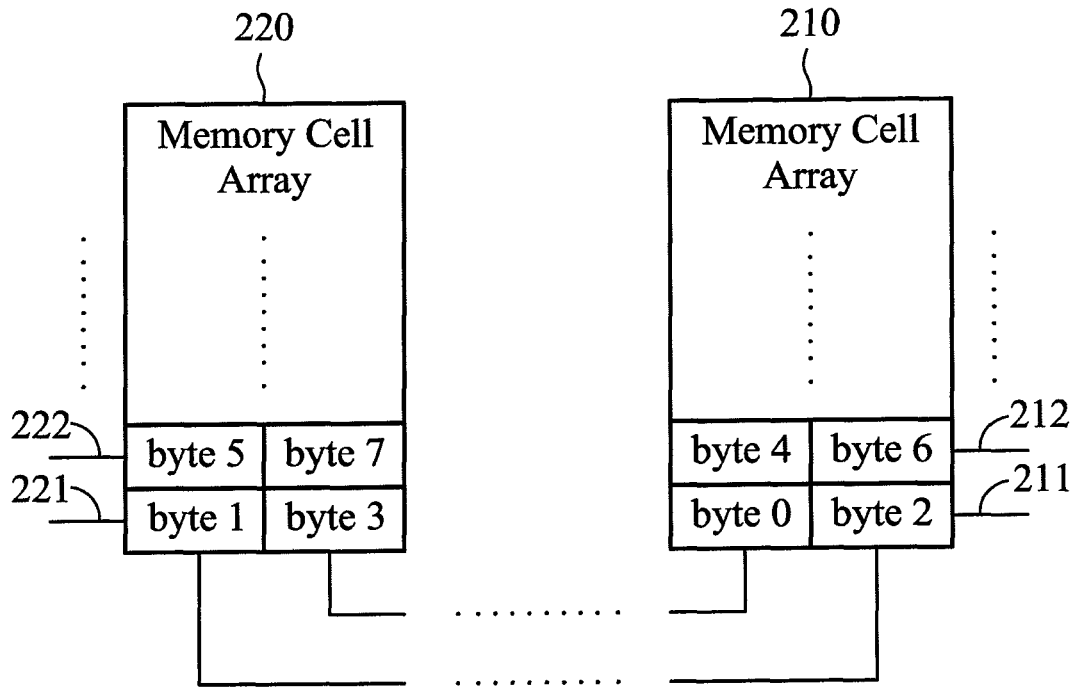
FIG. 3A is a diagram for illustrating a first memory cell array and a second memory cell array according to an embodiment of the invention.

FIG. 3A is a diagram for illustrating the first memory cell array 210 and the second memory cell array 220 according to an embodiment of the invention. As shown in FIG. 3A, the first data stored in the first memory cell array 210 comprises discontinuous bytes 0, 2, 4 and 6, and the second data stored in the second memory cell array 220 comprises discontinuous bytes 1, 3, 5 and 7. Each byte can be considered as one datum. A combination of the first data and the second data forms complete data comprising the continuous bytes 0 to 7. To simplify the diagram, not all of the bytes are displayed in FIG. 3A. It is understood that each memory cell array may store more bytes.

Figure 1:
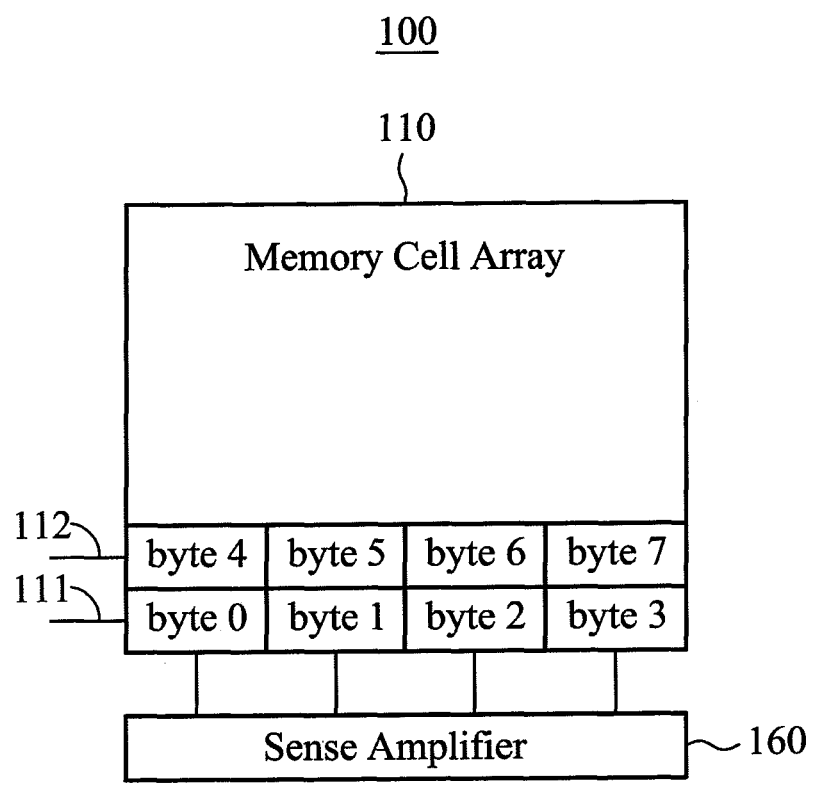
FIG. 1 is a diagram for illustrating a traditional memory device.
Figure 4A:
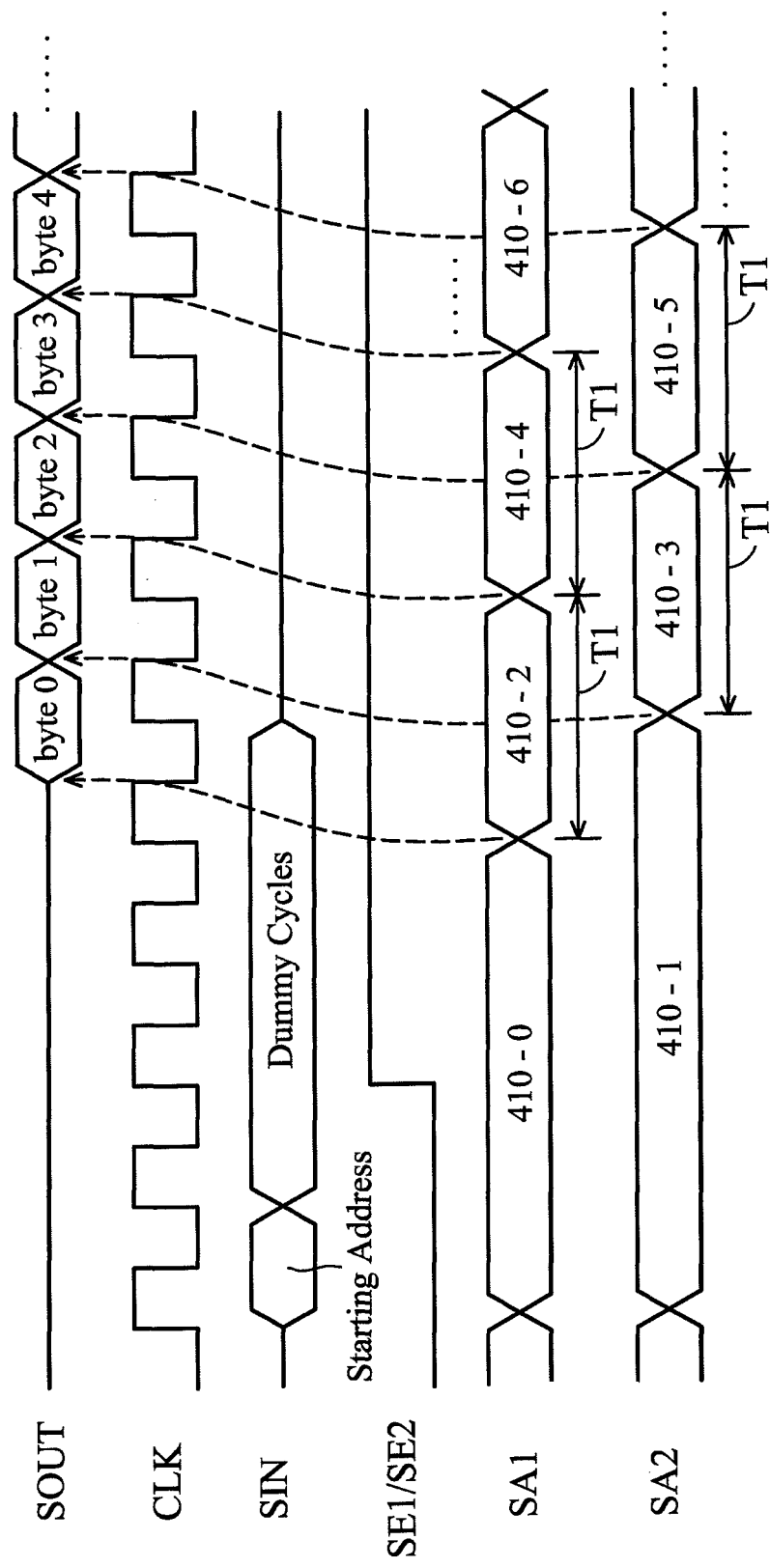
FIG. 4A is a diagram for illustrating signal waveforms of a memory device according to an embodiment of the invention.

FIG. 4A is a diagram for illustrating signal waveforms of the memory device 200 according to an embodiment of the invention. Refer FIG. 2, FIG. 3A and FIG. 4A together. When the input signal SIN is received, it takes several dummy clocks to initialize the reading process before the output data SOUT are generated. The addresses 410-0 to 410-7 (not all of them are shown) in FIG. 4A correspond to the bytes 0 to 7 in FIG. 3A, respectively. As shown in FIG. 4A, during the reading process, the control logic circuit 250 alternately selects the first address SA1 (e.g., one of the addresses 410-0, 410-2, 410-4 and 410-6) of the first memory cell array 210 and the second address SA2 (e.g., one of the addresses 410-1, 410-3, 410-5 and 410-7) of the second memory cell array 220 such that the first corresponding portion S1 (e.g., one of the bytes 0, 2, 4 and 6) of the first data and the second corresponding portion S2 (e.g., one of the bytes 1, 3, 5 and 7) of the second data are alternately read from the first memory cell array 210 and the second memory cell array 220. Although the stored first data and the stored second data are both discontinuous, the output data SOUT is continuous and complete. In the embodiment, every time the first address SA1 (e.g., the address 410-2) is selected, the data number of the read first corresponding portion S1 (e.g., the byte 2) is equal to 1, and every time the second address SA2 (e.g., the address 410-3) is selected, the data number of the read second corresponding portion. S2 (e.g., the byte 3) is also equal to 1. For example, in FIG. 3A, if the first word line 211 is selected, one (e.g., the byte 2) of the first data is read, and if the second word line 221 is selected, one (e.g., the byte 3) of the second data is read, wherein the first word line 211 and the second word line 221 may be selected at a same time or an overlapping time. In the embodiment, each of the first address SA1 and the second address SA2 is increased by 2 every two clock cycles. Except for the period of initialization, a sensing time T1 for reading the first corresponding portion S1 (e.g., the byte 2) and for reading the second corresponding portion S2 (e.g., the byte 3) is limited to a maximum period of two clock cycles. In comparison, the traditional memory device 100 of FIG. 1 has a sensing time limited to a maximum period of one clock cycle. Accordingly, the embodiment of FIGS. 2, 3A and 4A provides the enhanced reading speed, which is two times greater than that of traditional designs.

Figure 3B:
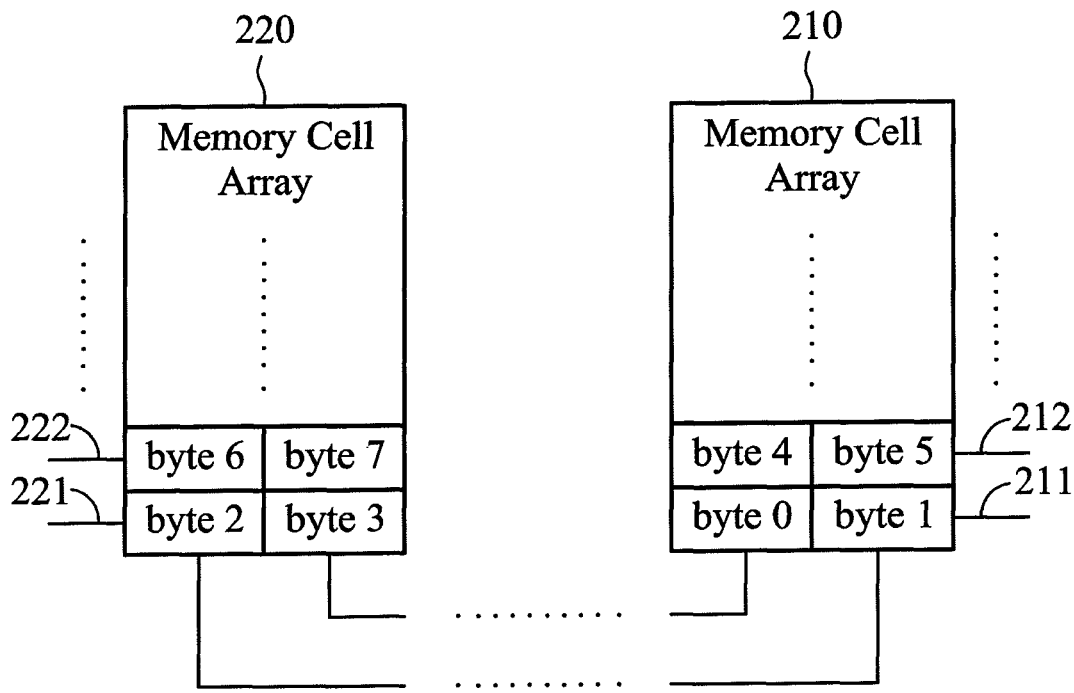
FIG. 3B is a diagram for illustrating a first memory cell array and a second memory cell array according to another embodiment of the invention.

FIG. 3B is a diagram for illustrating the first memory cell array 210 and the second memory cell array 220 according to another embodiment of the invention. As shown in FIG. 3B, the first data stored in the first memory cell array 210 comprises discontinuous bytes 0, 1, 4 and 5, and the second data stored in the second memory cell array 220 comprises discontinuous bytes 2, 3, 6 and 7. Each byte can be considered as one datum. A combination of the first data and the second data forms complete data comprising the continuous bytes 0 to 7. To simplify the diagram, not all of the bytes are displayed in FIG. 3B. It is understood that each memory cell array may store more bytes. FIG. 3B is similar to FIG. 3A. The difference from the embodiment of FIG. 3A is that any two adjacent bytes (e.g., the bytes 0 and 1) stored in each memory cell array of FIG. 3B may be continuous data. The arrangement can further increase the reading speed of the memory device 200.

Figure 4B:
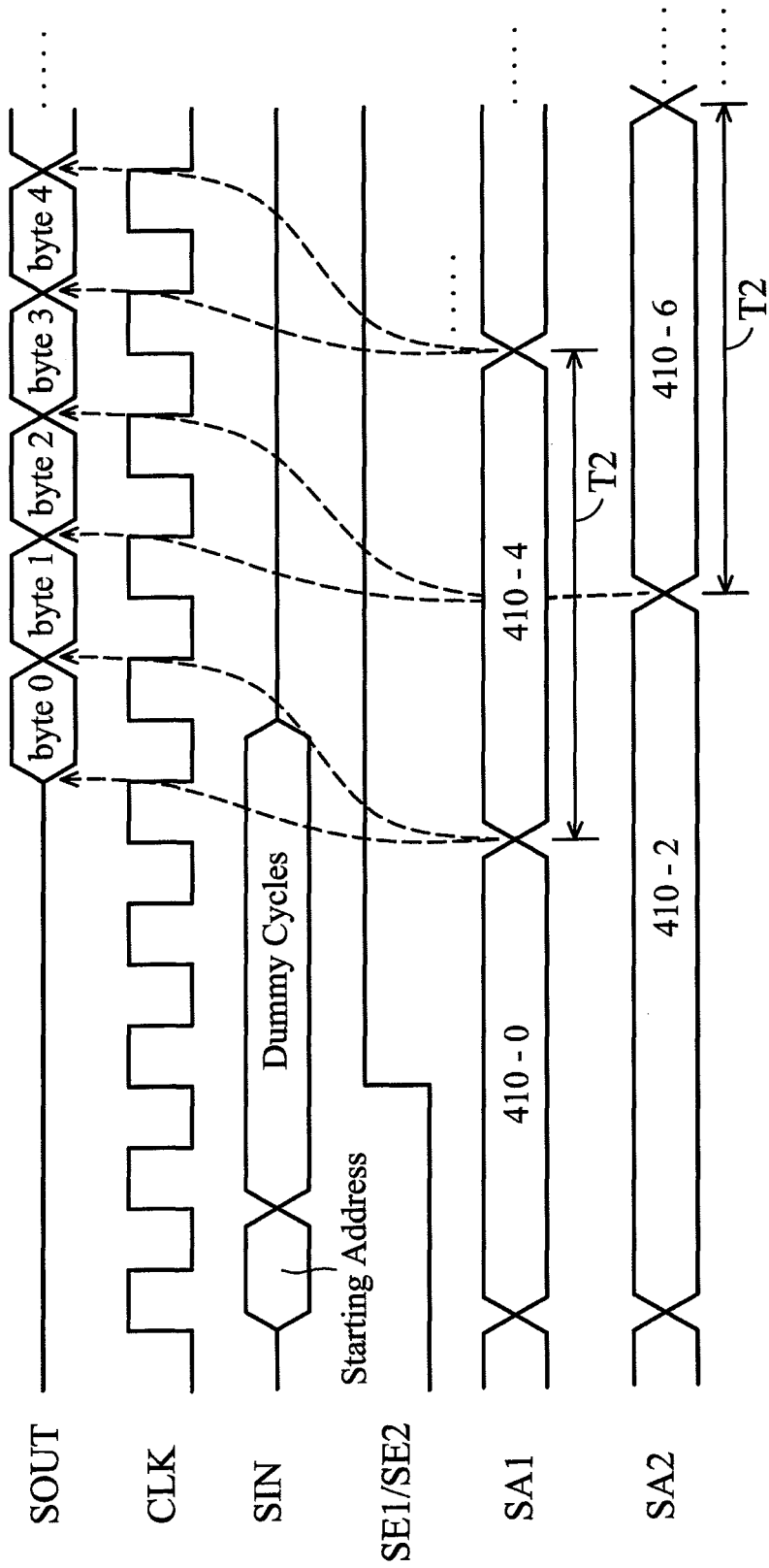
FIG. 4B is a diagram for illustrating signal waveforms of a memory device according to another embodiment of the invention.

FIG. 4B is a diagram for illustrating signal waveforms of the memory device 200 according to another embodiment of the invention. Refer FIG. 2, FIG. 3B and FIG. 4B together. When the input signal SIN is received, it takes several dummy clocks to initialize the reading process before the output data SOUT are generated. The addresses 410-0 to 410-7 (not all of them are shown) in FIG. 4B correspond to the bytes 0 to 7 in FIG. 3B, respectively. As shown in FIG. 4B, during the reading process, the control logic circuit 250 alternately selects the first address SA1 (e.g., one of the addresses 410-0 and 410-4) of the first memory cell array 210 and the second address SA2 (e.g., one of the addresses 410-2 and 410-6) of the second memory cell array 220 such that the first corresponding portion S1 (e.g., the bytes 0 and 1, or the bytes 4 and 5) of the first data and the second corresponding portion S2 (e.g., the bytes 2 and 3, or the bytes 6 and 7) of the second data are alternately read from the first memory cell array 210 and the second memory cell array 220. Although the stored first data and the stored second data are both discontinuous, the output data SOUT is continuous and complete. In the embodiment, every time the first address SA1 (e.g., the address 410-4) is selected, the data number of the read first corresponding portion S1 (e.g., the bytes 4 and 5) is equal to 2, and every time the second address SA2 (e.g., the address 410-6) is selected, the data number of the read second corresponding portion S2 (e.g., the bytes 6 and 7) is also equal to 2. For example, in FIG. 3B, if the first word line 212 is selected, continuous two (e.g., the bytes 4 and 5) of the first data are read together, and if the second word line 222 is selected, continuous two (e.g., the bytes 6 and 7) of the second data are read together, wherein the first word line 212 and the second word line 222 may be selected at a same time or an overlapping time. In the embodiment, each of the first address SA1 and the second address SA2 is increased by 4 every four clock cycles. Except for the period of initialization, a sensing time T2 for reading the first corresponding portion S1 (e.g., the bytes 4 and 5) and for reading the second corresponding portion S2 (e.g., the bytes 6 and 7) is limited to a maximum period of four clock cycles. In comparison, the traditional memory device 100 of FIG. 1 has a sensing time limited to a maximum period of one clock cycle. Accordingly, the embodiment of FIGS. 2, 3B and 4B provides the enhanced the reading speed, which is four times greater than that of traditional designs.

Figure 5:
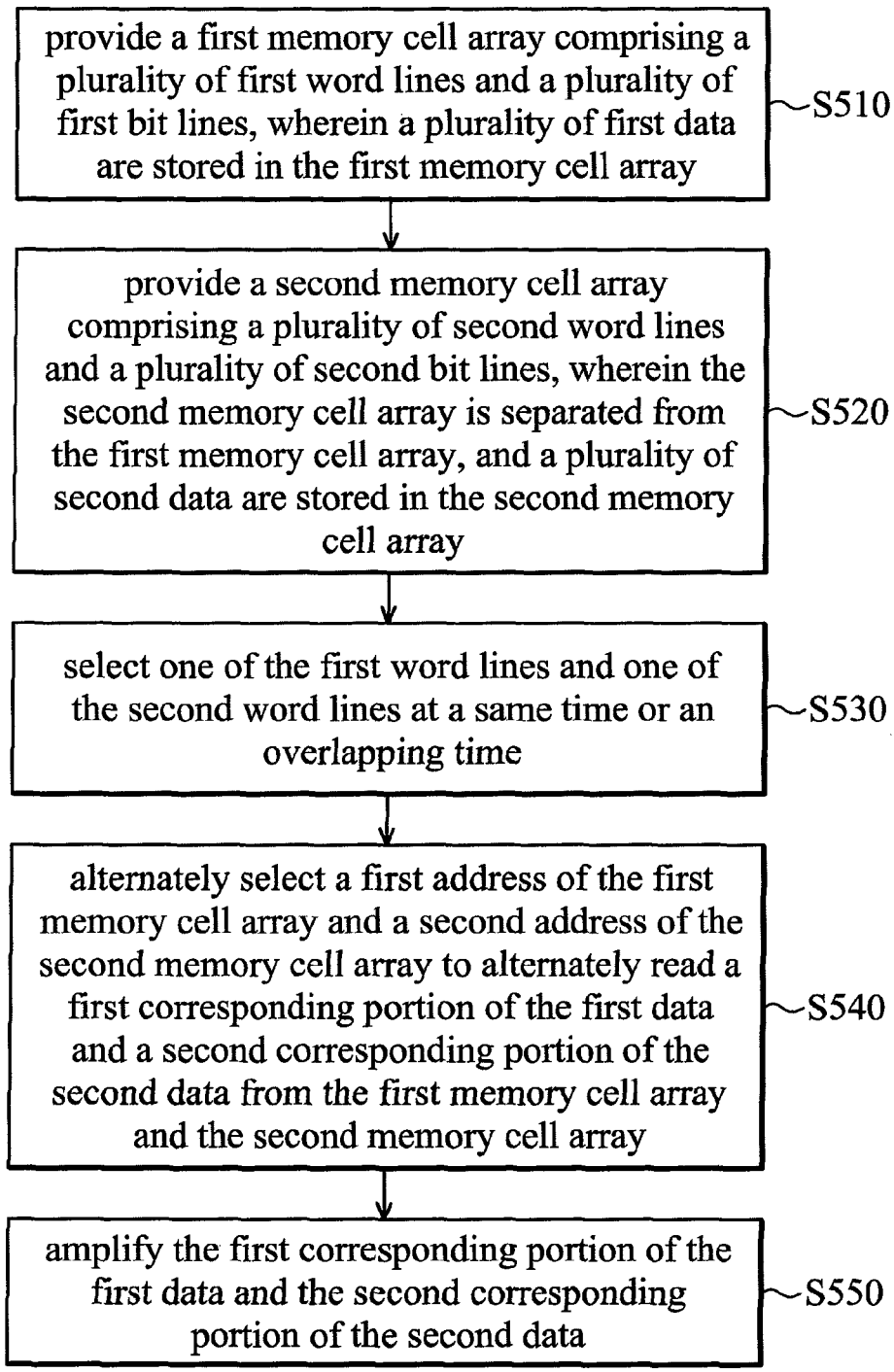
FIG. 5 is a flowchart for illustrating a method for reading data from a memory device according to an embodiment of the invention.

FIG. 5 is a flowchart for illustrating a method for reading data from a memory device according to an embodiment of the invention. To begin, in step S510, a first memory cell array comprising a plurality of first word lines and a plurality of first bit lines is provided, wherein a plurality of first data are stored in the first memory cell array. In step S520, a second memory cell array comprising a plurality of second word lines and a plurality of second bit lines is provided, wherein the second memory cell array is separated from the first memory cell array, and a plurality of second data are stored in the second memory cell array. In step S530, one of the first word lines and one of the second word lines are allowed to be selected at a same time or an overlapping time. In step S540, a first address of the first memory cell array and a second address of the second memory cell array are alternately selected to alternately read a first corresponding portion of the first data and a second corresponding portion of the second data from the first memory cell array and the second memory cell array. Finally, in step S550, the first corresponding portion of the first data and the second corresponding portion of the second data are amplified. Note that the foregoing steps may be not performed in order. The detailed features of the embodiments of FIGS. 2, 3A, 3B, 4A and 4B may be applied to the method of FIG. 5.

Figure 6A:
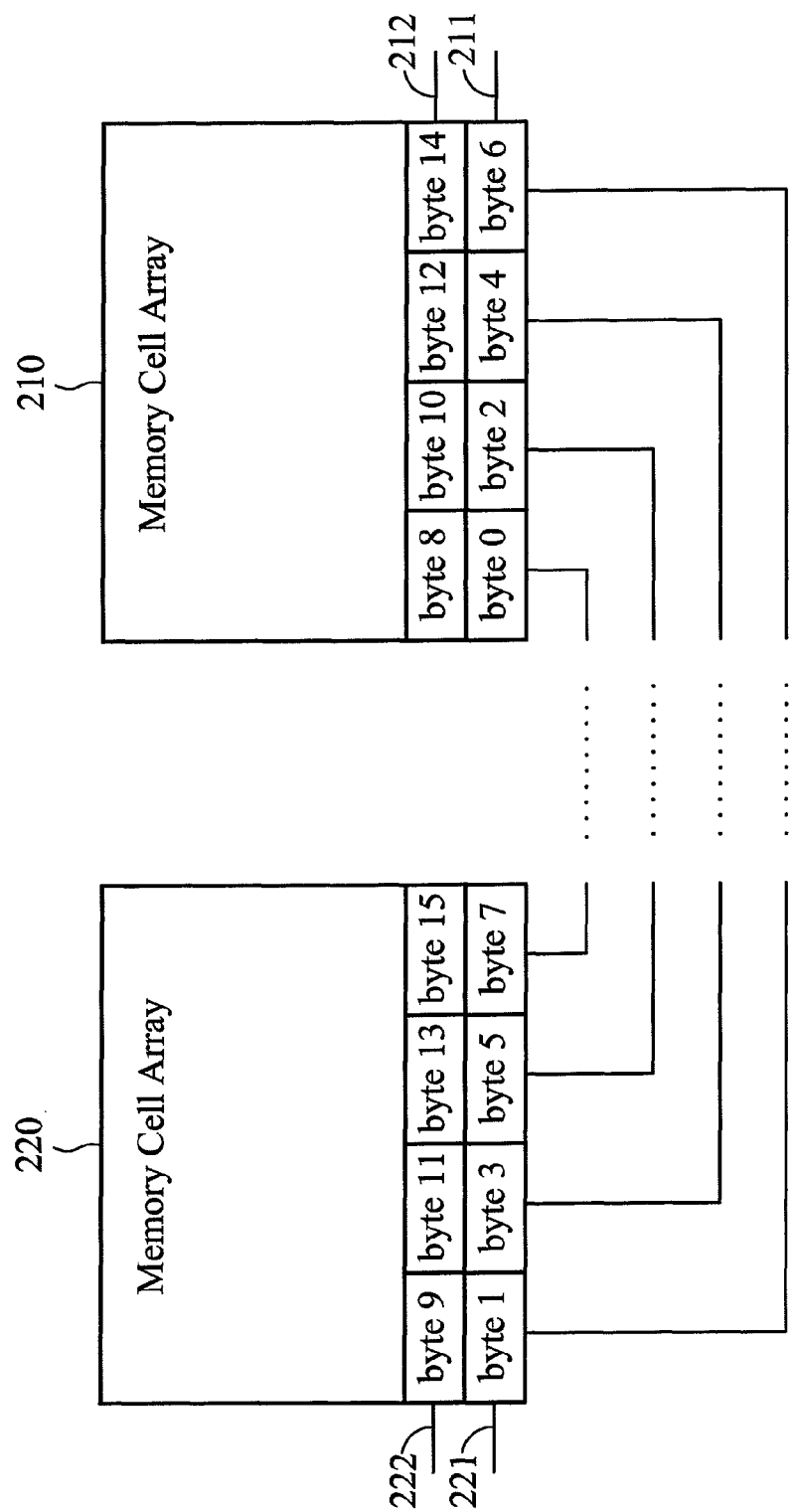
FIG. 6A is a diagram for illustrating a first memory cell array and a second memory cell array according to an embodiment of the invention.
Figure 6B:
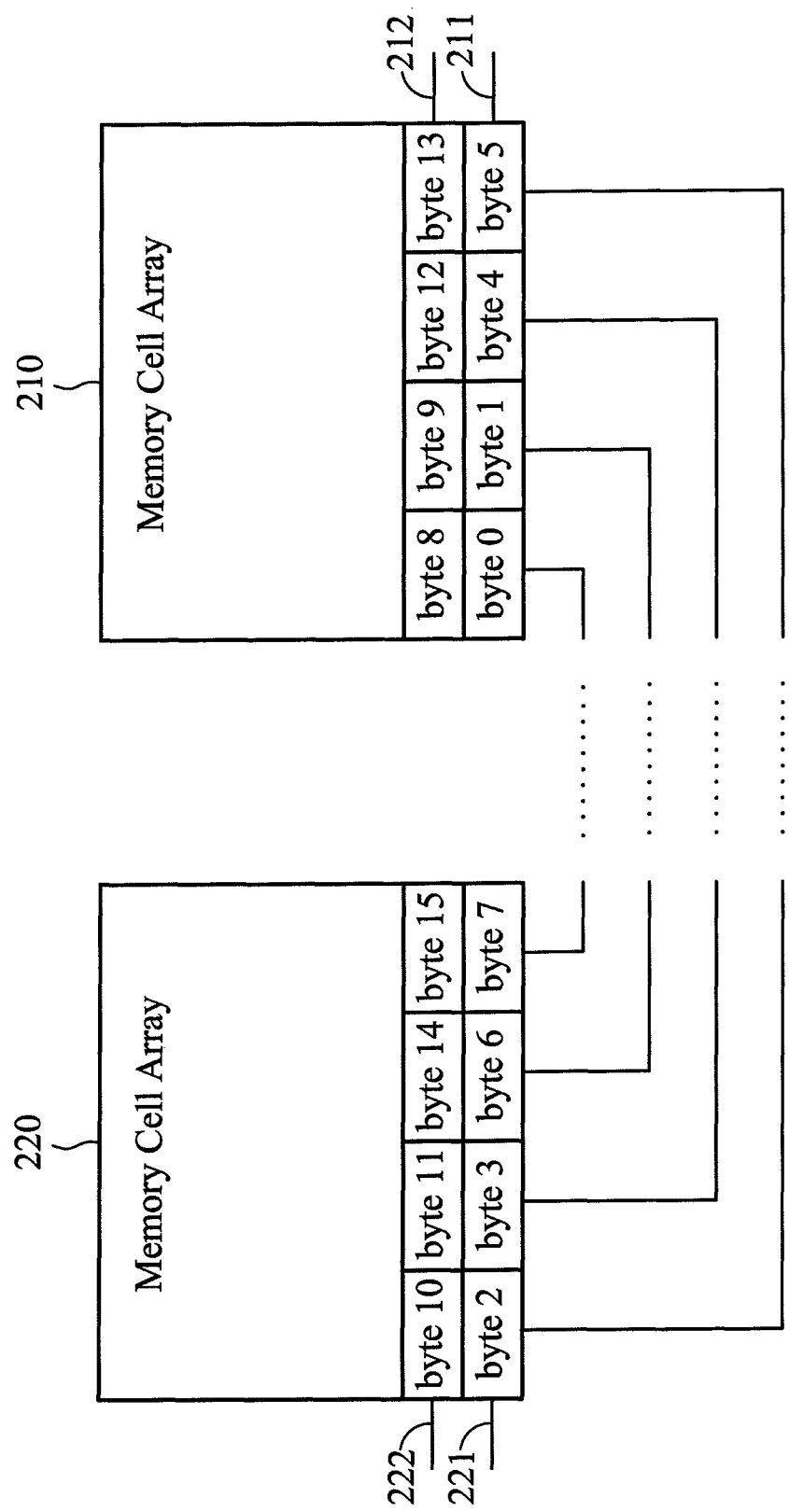
FIG. 6B is a diagram for illustrating a first memory cell array and a second memory cell array according to another embodiment of the invention.

The invention is not limited to having just two bytes per word line in each memory cell array. FIG. 6A is a diagram for illustrating the first memory cell array 210 and the second memory cell array 220 according to an embodiment of the invention. As shown in FIG. 6A, each memory cell array comprises four bytes per word line. The arrangement of FIG. 6A may lead to signal waveforms similar to those in FIG. 4A. FIG. 6B is a diagram for illustrating the first memory cell array 210 and the second memory cell array 220 according to another embodiment of the invention. As shown in FIG. 6B, each memory cell array comprises four bytes per word line. The arrangement of FIG. 6B may lead to signal waveforms similar to those in FIG. 4B. Note that the invention may be further applied to a variety of memory cell arrays, for example, memory cell arrays comprising 2, 4, 8, 16, 32, 64, 128, 256 or more data per word line.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A memory device, comprising:
   a first memory cell array, comprising a plurality of first word lines and a plurality of first bit lines, wherein a plurality of first data are stored in the first memory cell array;
   a second memory cell array, separated from the first memory cell array, and comprising a plurality of second word lines and a plurality of second bit lines, wherein a plurality of second data are stored in the second memory cell array;
   a control logic circuit, allowed to select one of the first word lines and one of the second word lines at a same time or an overlapping time, and alternately selecting a first address of the first memory cell array and a second address of the second memory cell array such that a first corresponding portion of the first data and a second corresponding portion of the second data are alternately read from the first memory cell array and the second memory cell array;
   a first sense amplifier, coupled via the first bit lines to the first memory cell array, and amplifying the first corresponding portion of the first data;
   a second sense amplifier, coupled via the second bit lines to the second memory cell array, and amplifying the second corresponding portion of the second data;
   a data multiplexer; and
   a shift register, wherein the data multiplexer is coupled to the first sense amplifier and the second sense amplifier, and the data multiplexer selectively transmits the first corresponding portion and the second corresponding portion to the shift register, and the shift register sequentially generates a plurality of output data according to the first corresponding portion and the second corresponding portion.

2. The memory device as claimed in claim 1, wherein each of the first address and the second address is increased by 2 every two clock cycles.

3. The memory device as claimed in claim 1, wherein a sensing time for reading the first corresponding portion and for reading the second corresponding portion is limited to a maximum period of two clock cycles.

4. The memory device as claimed in claim 1, wherein every time the first address is selected, the data number of the read first corresponding portion is equal to 1, and every time the second address is selected, the data number of the read second corresponding portion is equal to 1.

5. The memory device as claimed in claim 1, wherein each of the first address and the second address is increased by 4 every four clock cycles.

6. The memory device as claimed in claim 1, wherein a sensing time for reading the first corresponding portion and for reading the second corresponding portion is limited to a maximum period of four clock cycles.

7. The memory device as claimed in claim 1, wherein every time the first address is selected, the data number of the read first corresponding portion is equal to 2, and every time the second address is selected, the data number of the read second corresponding portion is equal to 2.

8. The memory device as claimed in claim 1, wherein the first data stored in the first memory cell array and the second data stored in the second memory cell array are both discontinuous data.

9. The memory device as claimed in claim 1, wherein a combination of the first data and the second data forms complete continuous data.

10. A method for reading data from a memory device, comprising the steps of:
providing a first memory cell array comprising a plurality of first word lines and a plurality of first bit lines, wherein a plurality of first data are stored in the first memory cell array;
providing a second memory cell array comprising a plurality of second word lines and a plurality of second bit lines, wherein the second memory cell array is separated from the first memory cell array, and a plurality of second data are stored in the second memory cell array;
selecting one of the first word lines and one of the second word lines at a same time or an overlapping time;
alternately selecting a first address of the first memory cell array and a second address of the second memory cell array to alternately read a first corresponding portion of the first data and a second corresponding portion of the second data from the first memory cell array and the second memory cell array;
amplifying the first corresponding portion of the first data and the second corresponding portion of the second data;
selectively transmitting the first corresponding portion of the first data and the second corresponding portion of the second data by a data multiplexer to a shift register; and
sequentially generating a plurality of output data according to the first corresponding portion and the second corresponding portion by the shift register.

11. The method as claimed in claim 10, wherein each of the first address and the second address is increased by 2 every two clock cycles.

12. The method as claimed in claim 10, wherein a sensing time for reading the first corresponding portion and for reading the second corresponding portion is limited to a maximum period of two clock cycles.

13. The method as claimed in claim 10, wherein every time the first address is selected, the data number of the read first corresponding portion is equal to 1, and every time the second address is selected, the data number of the read second corresponding portion is equal to 1.

14. The method as claimed in claim 10, wherein each of the first address and the second address is increased by 4 every four clock cycles.

15. The method as claimed in claim 10, wherein a sensing time for reading the first corresponding portion and for reading the second corresponding portion is limited to a maximum period of four clock cycles.

16. The method as claimed in claim 10, wherein every time the first address is selected, the data number of the read first corresponding portion is equal to 2, and every time the second address is selected, the data number of the read second corresponding portion is equal to 2.

17. The method as claimed in claim 10, wherein the first data stored in the first memory cell array and the second data stored in the second memory cell array are both discontinuous data.

18. The method as claimed in claim 10, wherein a combination of the first data and the second data forms complete continuous data.

* * * * *